US012677673B2

(12) United States Patent
Wang et al.

(10) Patent No.: US 12,677,673 B2
(45) Date of Patent: Jul. 7, 2026

(54) ALIGNMENT METHOD FOR IMAGE SENSOR FABRICATION AND ASSOCIATED SEMICONDUCTOR DEVICE

(71) Applicant: OmniVision Technologies, Inc., Santa Clara, CA (US)

(72) Inventors: Qin Wang, San Jose, CA (US); Yu Jin, New Jersey, CA (US)

( * ) Notice: Subject to any disclaimer, the term of this patent is extended or adjusted under 35 U.S.C. 154(b) by 679 days.

(21) Appl. No.: 18/162,066

(22) Filed: Jan. 31, 2023

(65) Prior Publication Data

US 2023/0245977 A1     Aug. 3, 2023

Related U.S. Application Data

(60) Provisional application No. 63/305,321, filed on Feb. 1, 2022.

(51) Int. Cl.
| | | |
|---|---|---|
| *H10W 46/00* | (2026.01) | |
| *H10F 39/00* | (2025.01) | |
| *H10F 39/18* | (2025.01) | |

(52) U.S. Cl.
CPC .......... *H10W 46/00* (2026.01); *H10F 39/011* (2025.01); *H10F 39/014* (2025.01); *H10F 39/18* (2025.01); *H10F 39/807* (2025.01);

*H10W 46/101* (2026.01); *H10W 46/301* (2026.01); *H10W 46/503* (2026.01)

(58) Field of Classification Search
CPC ............ H10W 46/101; H10W 46/301; H10W 46/503; H10W 46/00; H10F 39/011; H10F 39/014; H10F 39/18; H10F 39/807
See application file for complete search history.

(56) References Cited

U.S. PATENT DOCUMENTS

| | | | |
|---|---|---|---|
| 8,357,561 B2 | 1/2013 | Fu et al. | |
| 8,779,539 B2 | 7/2014 | Kao et al. | |
| 9,627,326 B2 * | 4/2017 | Chou ..................... | H01L 23/544 |
| 2012/0025199 A1 * | 2/2012 | Chen ..................... | H10F 39/199 |
| | | | 438/96 |
| 2013/0075938 A1 * | 3/2013 | Yang ......................... | G03F 1/42 |
| | | | 257/E23.179 |
| 2021/0074758 A1 * | 3/2021 | Takahashi ........... | H10F 39/8063 |

* cited by examiner

*Primary Examiner* — Britt Hanley
*Assistant Examiner* — Victor V Barzykin

(57)     ABSTRACT

The present disclosure provides an alignment method for image sensor fabrication that involve forming a number of set of alignment marks using key process mask layers to improve alignment registration between process mask layers so as to reduce number of alignment transfer improves alignment accuracy between pixel elements. The present disclosure further provides a semiconductor device that includes such alignment mark structures.

11 Claims, 17 Drawing Sheets

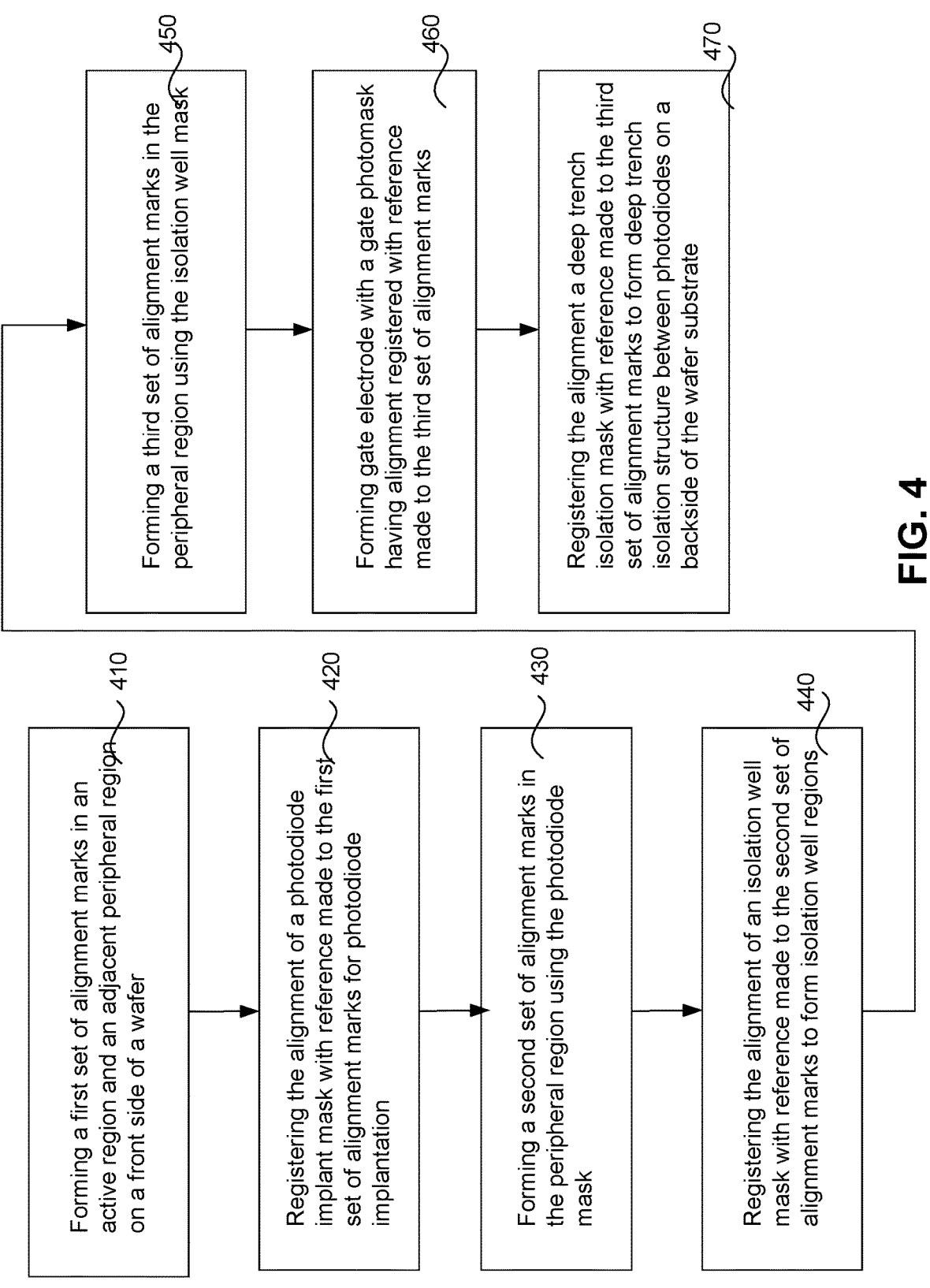

Forming a first set of alignment marks in an active region and an adjacent peripheral region on a front side of a wafer — 410

Registering the alignment of a photodiode implant mask with reference made to the first set of alignment marks for photodiode implantation — 420

Forming a second set of alignment marks in the peripheral region using the photodiode mask — 430

Registering the alignment of an isolation well mask with reference made to the second set of alignment marks to form isolation well regions — 440

Forming a third set of alignment marks in the peripheral region using the isolation well mask — 450

Forming gate electrode with a gate photomask having alignment registered with reference made to the third set of alignment marks — 460

Registering the alignment a deep trench isolation mask with reference made to the third set of alignment marks to form deep trench isolation structure between photodiodes on a backside of the wafer substrate — 470

FIG. 4

Cross-section figure E-E'

ALIGNMENT METHOD FOR IMAGE SENSOR FABRICATION AND ASSOCIATED SEMICONDUCTOR DEVICE

RELATED APPLICATIONS

This application claims benefit to U.S. Provisional Patent Application No. 63/305,321 filed Feb. 1, 2022, the entirety of which is incorporated herein by reference.

TECHNICAL FIELD

This disclosure relates to a fabrication method for image sensor and more particularly but not exclusively relates to alignment method for image sensor fabrication and associated semiconductor device.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

FIG. 4 illustrates fabrication method for an image senor in accordance with the teachings of the present disclosure.

DETAILED DESCRIPTION

Figure 1A:
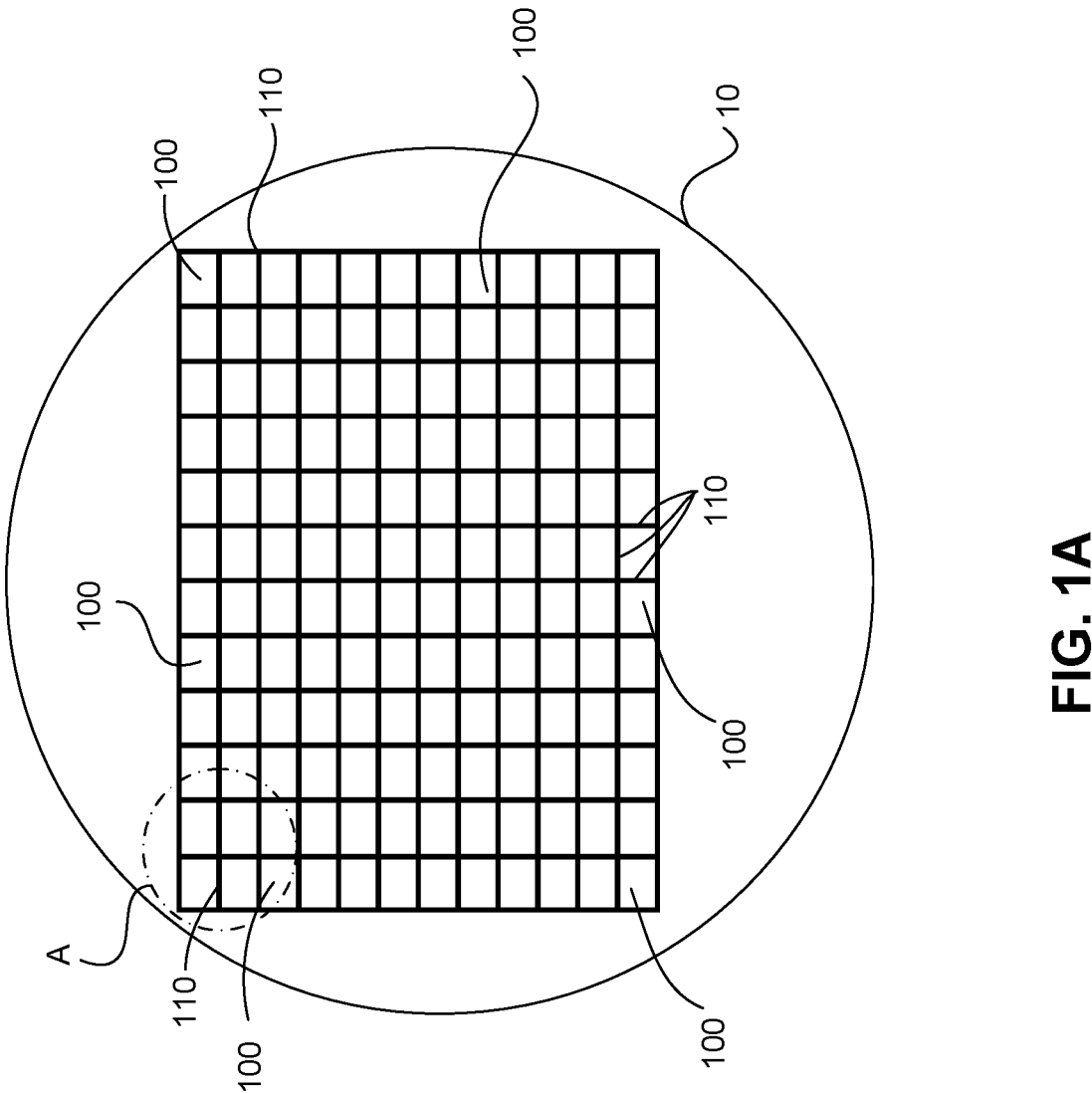
FIG. 1A illustrates a plane view of wafer having a plurality dies and scribe line regions.

The term "first", "second" or the like used herein may modify various elements regardless of order and/or priority, but does not limit the elements. Such terms may be used to distinguish one element from another element. For example, "a first user device" and "a second user device" may indicate different user devices regardless of order or priority. For example, without departing the scope of the present disclosure, a first element may be referred to as a second element and vice versa.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Further, it will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Further still, it will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

The term "have", "may have", "include", "may include" or "comprise" used herein indicates the existence of a corresponding feature (e.g., a number, a function, an operation, or an element) and does not exclude the existence of an additional feature.

The term "A or B", "at least one of A and/or B", or "one or more of A and/or B" may include all possible combinations of items listed together. For example, the term "A or B", "at least one of A and B", or "at least one of A or B" may indicate all the cases of (1) including at least one A, (2) including at least one B, and (3) including at least one A and at least one B.

It will be understood that when a certain element (e.g., a first element) is referred to as being "operatively or communicatively coupled with/to" or "connected to" another element (e.g., a second element), the certain element may be coupled to the other element directly or via another element (e.g., a third element). However, when a certain element (e.g., a first element) is referred to as being "directly coupled" or "directly connected" to another element (e.g., a second element), there may be no intervening element (e.g., a third element) between the element and the other element.

The term "configured (or set) to" may be interchangeably used with the term, for example, "suitable for", "having the capacity to", "designed to", "adapted to", "made to", or "capable of". The term "configured (or set) to" may not necessarily have the meaning of "specifically designed to". In some cases, the term "device configured to" may indicate that the device "may perform" together with other devices or components. For example, the term "processor configured (or set) to perform A, B, and C" may represent a dedicated processor (e.g., an embedded processor) for performing a corresponding operation, or a generic-purpose processor (e.g., a CPU or an application processor) for executing at least one item of software or program stored in a memory device to perform a corresponding operation.

In the following description, numerous specific details are given to provide a thorough understanding of embodiments. The embodiments can be practiced without one or more of the specific details, or with other methods, components, materials, etc. In other instances, well-known structures, materials, or operations, such as, for example, processors, spectrometers, etc., are not shown or described in detail to avoid obscuring aspects of the embodiments. Further, reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In order to properly fabricate an image sensor, alignment between each key processing layers in the front-side end of line (FEOL) wafer process or backside end of line (BEOL) wafer process is critical for ensuring precise arrangement of pixel circuit components such as photodiodes, isolation structure, pixel transistors, and the like. For example, during the front-side end of line processing of a wafer, each implantation mask layer used for photodiode implants, source and drain implants for transistor, anti-blooming implants for blooming leakage path, floating diffusion implants, isolation implants must be accurately aligned to an existing pattern formed on the front side of the wafer. Similarly, during backside processing of the wafer, processing layer for forming backside deep trench isolation, metal grid array that involve material deposition with selective etching must be accurately aligned to the existing pattern on formed during the front side processing of the wafer.

Alignment is the process of determining the position, orientation, and distortion of the patterns that are already formed on the wafer and then placing add-on elements in correct relation to the projected image from the existing pattern. Alignment marks are visible patterns to processing tools, and are placed on the wafer to determine their position and orientation. However, when multiple processing layers (e.g., photoresist mask layers) are making reference to the same existing pattern, and transferring such alignment pattern over to subsequent process layers, overlay shift could occur and induce shifts in alignment along both X- and Y-directions during each transfer. That is, the overall overlay variation accumulated is related to the number of transfer in alignment. The overall accumulated overlay often increases along with the number of times of alignment transfer, which ultimately results in misalignment between the already-formed components and later-formed components. For example, misalignment may occur between photodiode implanted region and isolation structure as well as between isolation structures. Such misalignment issue become more prominent in particular in small pixel design (e.g., sub-micron pixel) as small pixel design has smaller process margin.

Figure 1B:
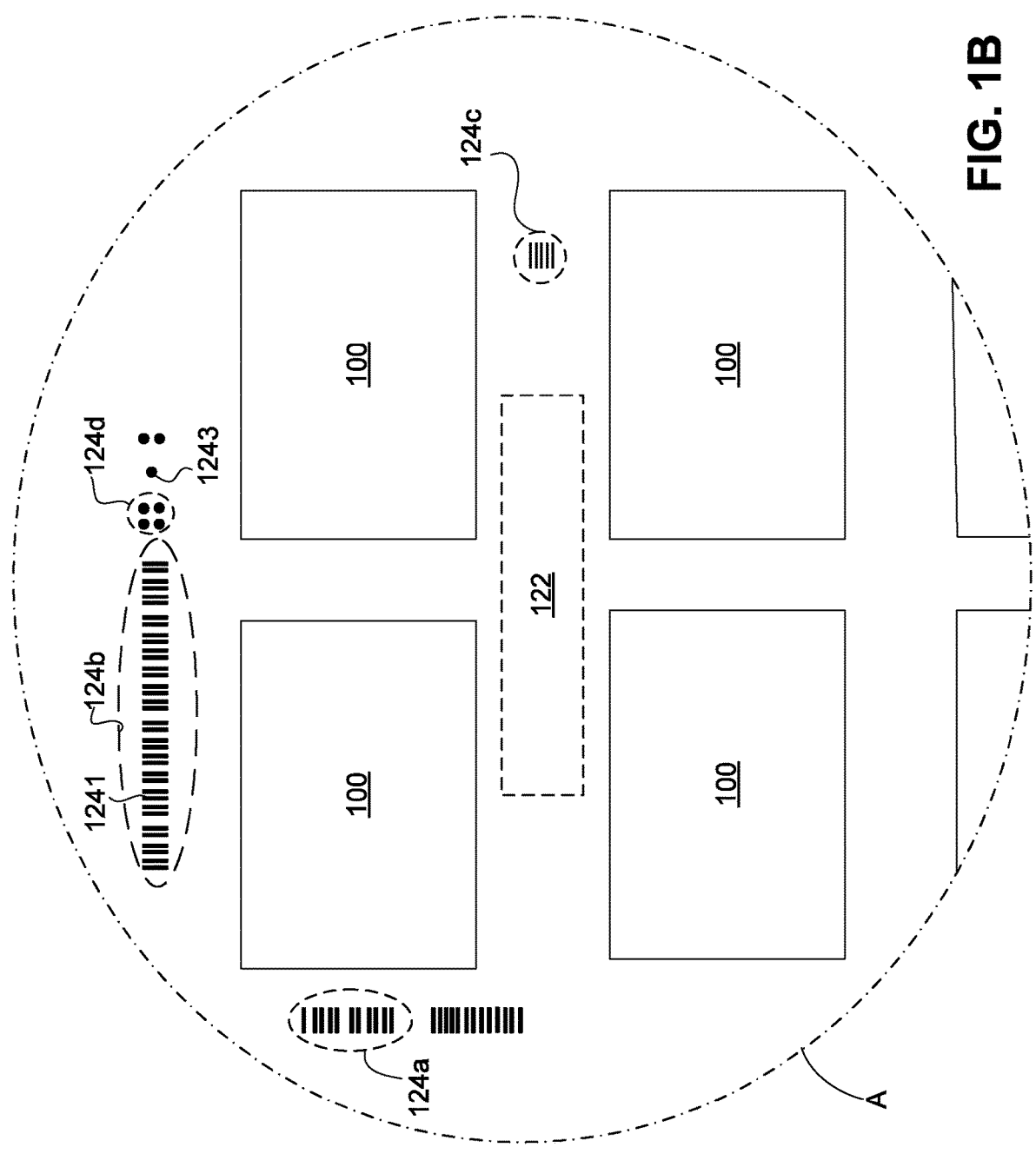
FIG. 1B illustrates an exemplary alignment marking on a wafer in accordance to conventional alignment process.

FIG. 1A illustrates a wafer 10 that has a plurality of dies 100 and a plurality of scribe line regions 110 arranged thereon. Each die 100 may be in part for forming an image sensor. Each die 100 may include a plurality of photodiodes, pixel transistors, metal interconnects, metal contacts, metal pads, and one or more integrated circuitries that provide an operation environment for the image sensor and supporting external communications with the image sensor. Each of scribe line regions 110 may be placed between individual die 100 separating adjacent die 100 from each other. Each of scribe line regions 110 disposed between adjacent dies 100 may include one or more groups of alignment marks 124*a-e* for aforementioned process alignment reference, testing region 122 including one or more testing circuitries, metal interconnect, device transistors, probe contacts for wafer acceptance tests or device characteristic measurements as illustrated in FIG. 1B, which illustrates a zoom-in view A of FIG. 1A. Each of the one or more groups of alignment marks 124a-124e may each include one or more patterns visible markings on the wafer 10 for processing tools, use as position and orientation reference. It is appreciate that the one or more patterns included in the one or more groups of alignment marks 124a-124e are visible markings to processing tools but may or may not be readily visible to human eye as 1) the sizes of the one or more patterns may be very small (e.g., in micron or sub-micron range), and 2) there could be processing layers overlay on top embedding these markings. The one or more marking patterns may be trench-type alignment marks having different shapes including but not limited to rectangular pattern (stripe pattern) 1241, circular or pillar-shaped pattern 1243, and triangular-shaped. The one or more patterns may be arranged in an array form or based on specific pattern including arranged with various spacing and dimensions for alignment registration identification used.

Figure 2A:
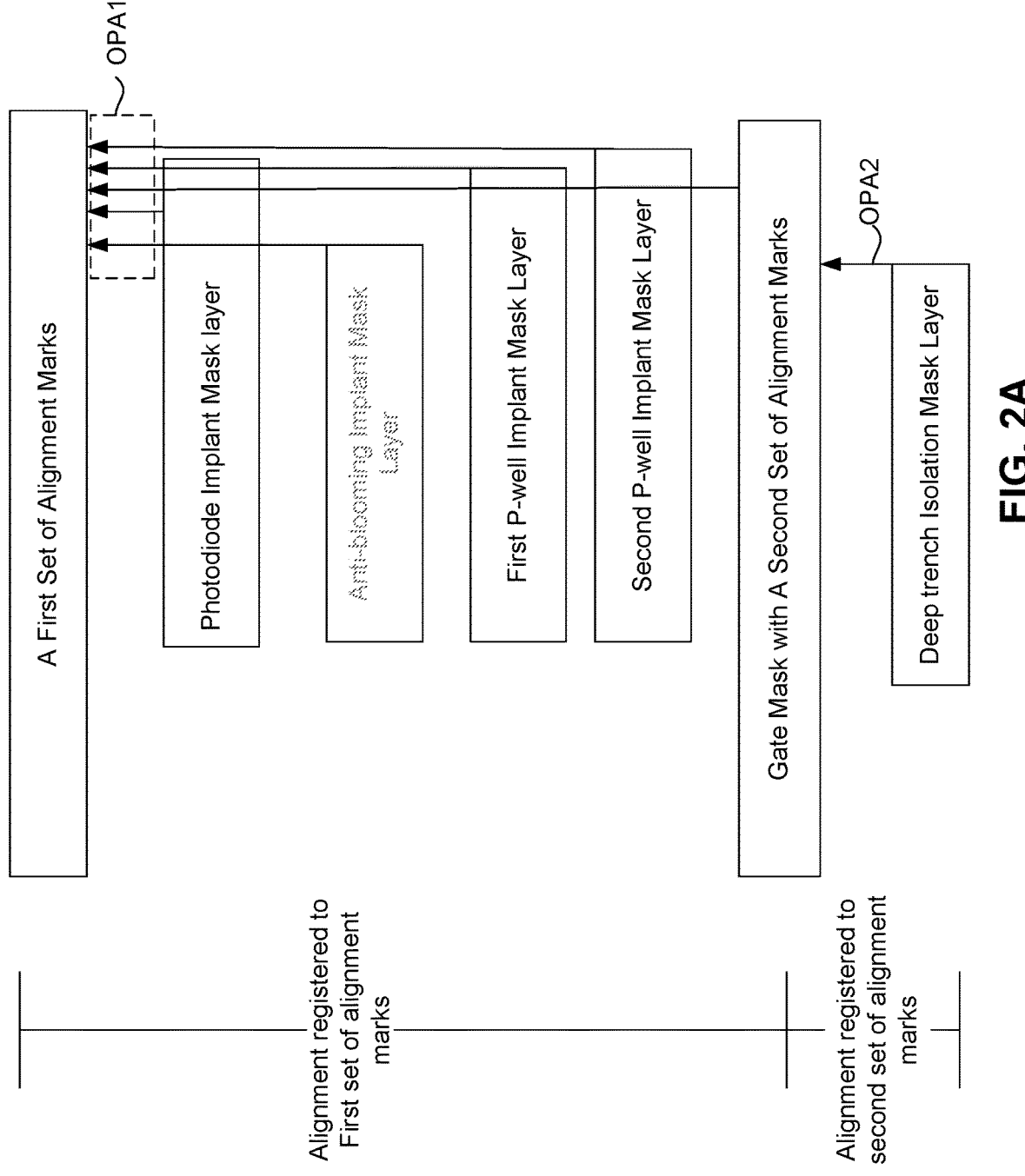
FIG. 2A illustrates an example alignment tree of conventional process.

Referring to FIG. 2A, which illustrates an example of alignment tree used for pixel fabrication for an image sensor. As illustrated, a set of alignment marks is formed on the wafer 10 and the set of alignment marks may be formed proximate to an edge of the wafer or in one or more scribe line regions 110. In embodiments, the set of alignment marks may include one or more patterns such as group of alignment mark 124a or 124b. The set of alignment marks may be a plurality of shallow trench structures. In some embodiments, the plurality of shallow trench structures the scribe line regions 110 that function as alignment mark may be filled with dielectric material. In some embodiments, the plurality of shallow trench structures may have substantially identical trench characteristics (such as having substantially the same trench width, the same trench depth, and the same trench profile) as shallow trench structures in an active region (such as pixel array region) of individual die 100.

Photodiode implant mask layer is an ion-implantation mask layer for implanting dopants of a first conductive type (e.g., n-type) into wafer substrate material region of the wafer 10 within corresponding pixel array region on each die 100 forming photodiode doped regions that form a plurality of photodiodes. Anti-blooming implant mask layer may be an ion-implantation mask layer for implanting dopants of the first conductive type (e.g., n-type) into wafer substrate material region within corresponding pixel array region on each die 100 forming a plurality of blooming leakage path between photodiodes and later-formed floating diffusion region. First P-well implant mask layer and second P-well implant mask layer, each may be an ion-implantation mask layer for implanting dopants of a second conductive type (e.g., p-type) opposite to first conductive type into wafer substrate material region within corresponding pixel array region on each die 100 forming a plurality of implanted well region in the wafer substrate material region of wafer 10 providing electrical isolation between pixel element such as between adjacent photodiodes. In some embodiments where the plurality of photodiodes are grouped into a plurality of pixel cells, the first P-well implant mask layer thus may have patterns for forming a first isolation well region surrounding each pixel cell and the second P-well implant mask layer may have patterns for forming second isolation well region between photodiode doped region of adjacent photodiodes within a pixel cell providing electrical isolation between photodiodes within the pixel cell. Gate mask layer is a mask layer for forming gate electrodes for pixel transistors, such as transfer gate, gate for source follower, gate reset transistor, and gate for row-select transistor. Gate mask layer may enable process to selective etching deposited polysilicon gate material to form gate electrodes for pixel transistors and/or contacts. Deep trench isolation mask layer is a mask layer for forming deep trench isolation between adjacent photodiodes on the backside of the wafer 10.

As indicated by the outward pointing arrows OPA1 shown in FIG. 2A, each of key mask layers for forming main elements within a pixel array region including photodiode implant mask layer, anti-blooming implant mask layer, P-well implant mask layers, and gate mask layer may have their alignment references all made to the same first set of alignment marks, e.g., same set of shallow trench isolation alignment marks on the wafer 10 in one or more scribe line regions 110 of FIG. 1B. Deep trench isolation mask layer may have alignment reference made to a second set of alignment marks that are formed using the gate mask layer as illustrated by the outward pointing arrow OPA2 in FIG. 2A. As such, overlay shift accumulates from process to process via transfer of alignment mark between key mask layers resulting in misalignment, which greatly impact overall image sensor performance. For example, the number of times of alignment transfer from first P-well implant mask layer to second P-well implant mask layer may be two, and the number of times of alignment transfer from second P-well implant mask layer to deep trench isolation mask layer may be three. Each alignment transfer induces pattern shift along X- and/or Y-directions. In a two-time alignment transfer, a $2\times\sigma$ amount of shift in X- and/or Y-direction may occur, with a standard deviation of overlay shift is about $\sqrt{2}\sigma$. Hence, the more times, the alignment marks are transferred, the greater amount of accumulated overlay shift resulted leading to misalignment between pixel elements that degrades pixel performance. For instance, misalignment between photodiodes and isolation well region could affect the photodiode size as well as full well capacity of photodiodes; misalignment between photodiodes and the transfer gate could affect charge transfer performance such as transfer imbalance among photodiodes; misalignment among photodiodes, floating diffusion region and blooming leakage path could affect blooming performance such as blooming imbalance; misalignment between deep trench isolation and photodiodes affecting pixel isolation performance; and misalignment between deep trench isolation and isolation well region affecting dark current performance leading image artifacts such as white pixel.

Figure 2B:
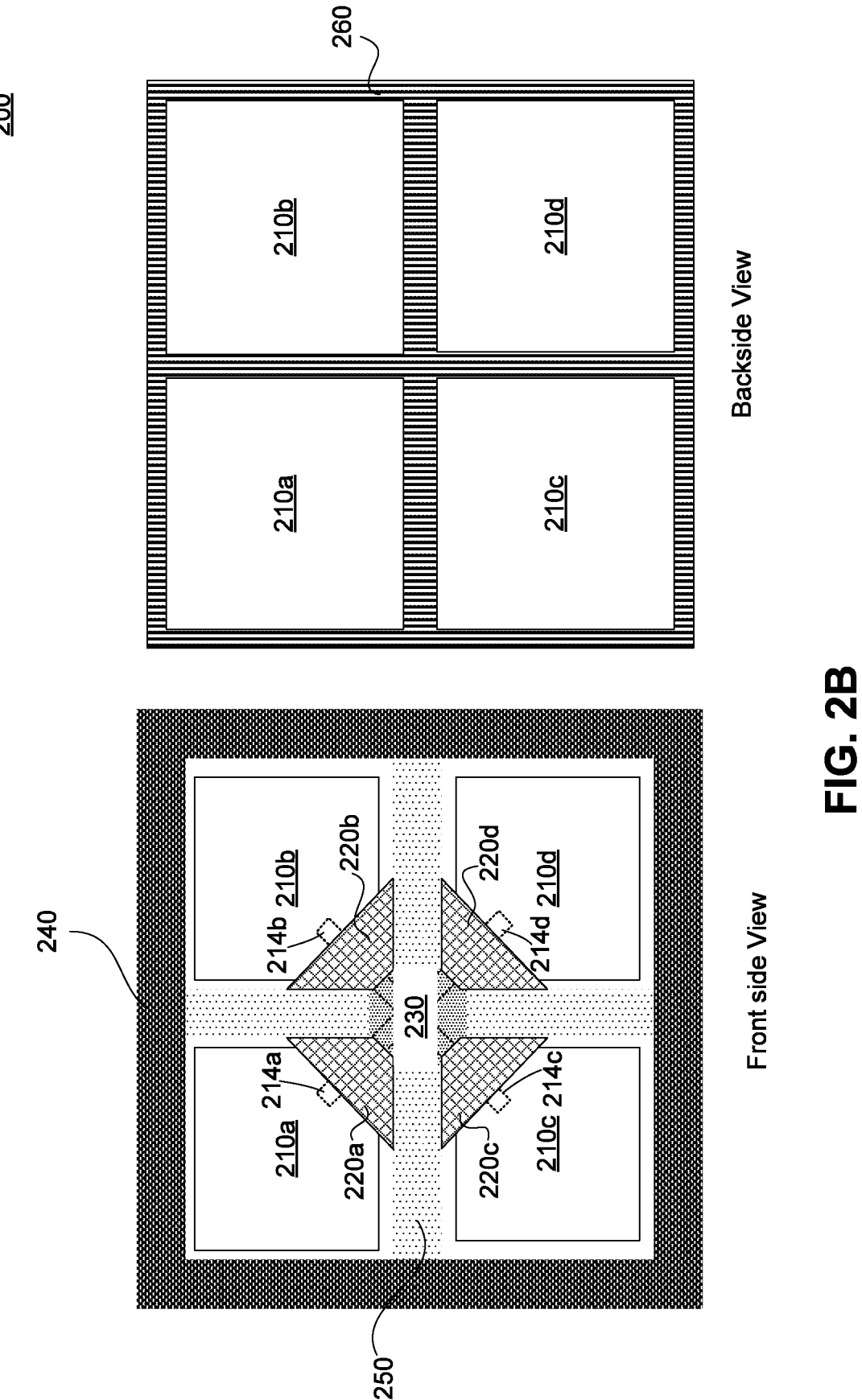
FIG. 2B illustrates an example pixel layout with proper alignment between pixel elements.

FIG. 2B shows an example of a pixel layout for a pixel cell 200 with elements being properly aligned during fabrication process. A pixel array of an image sensor may include a plurality of pixel cells 200 arranged in an array form formed on a die. The die may be one of dies included in a plurality of dice on a wafer, such as one of the dice 100 on the wafer 100 shown in FIG. 1A.

Pixel cell 200 includes a plurality of photodiodes 210a-210d, floating diffusion region 230, a plurality of transfer gates 220a-220d, first isolation well 240, and second isolation well 250. The plurality of photodiodes 210a-210d is coupled to the floating diffusion region 230 through corresponding transfer gates 220a-220d to selectively transfer photo-generated charges to floating diffusion region 230 for subsequent readout. Each of photodiodes 210a-210d may be formed by ion implantation using aforementioned photodiode implant mask layer into the wafer. The wafer may be a silicon substrate. The blooming leakage path 214a-214d may be formed by ion implantation using aforementioned anti-blooming implant mask layer into the active region of the wafer. The blooming leakage path 214a-214d may be implanted between respective photodiode 210a-210d and later-formed floating diffusion region 230. For example, blooming leakage path 214a is formed between photodiode 210b and floating diffusion region 230 providing blooming leakage path therebetween during image senor operation. Blooming leakage path 214b is formed between photodiode 210b and floating diffusion region 230 providing blooming leakage path therebetween during image senor operation, and so on. Each of transfer gates 220a-220d may formed on a front side of the wafer or non-illuminated side of image sensor with position corresponding to the photodiodes 210a-210d using aforementioned gate mask layer. The floating diffusion region 230 may be formed by ion implantation with alignment made to transfer gate 220a-220d e.g., implant with alignment made to edges of respective transfer gates 220a-220d. First isolation well 240 of second conductive type (e.g., p-type) surrounds the photodiodes 210a-210d in pixel cell 200 and provide electrical isolation between adjacent pixel cells. First isolation well 240 may be formed by ion implantation using aforementioned first P-well implant mask layer into the wafer. Second isolation well 250 of second conductive type (e.g., p-type) is arranged between the photodiodes 210a-210d within in the pixel cell 200 providing electrical isolation between adjacent photodiodes 210a-210d. First isolation well 240 and second isolation well 250 may be referred as isolation well region and may be coupled to each other or in part overlapped with each other. First isolation well 240 and second isolation well 250 may each having a conductive type that is opposite to the photodiodes 210a-210d and floating diffusion region 230.

In some embodiments, second isolation well 250 and first isolation well 240 may be interconnected. Second isolation well 250 may be formed by ion implantation using aforementioned second P-well implant mask layer into the wafer.

Deep trench isolation structure 260 may be formed on a backside of the wafer opposite to the front side or illuminated side of the image sensor and between adjacent photodiodes 210a-210b providing electrical and/or optical isolation between adjacent photodiodes 210a-210b and between adjacent pixel cells. Deep trench isolation structure 260 may define the pixel cell region for pixel cell 200. Deep trench isolation structure 260 may be aligned with position of first isolation well 240 and second isolation well 250. Deep trenches of deep trench isolation structure 260 may be formed using the aforementioned deep trench isolation mask layer.

Figures 2C, 2D:
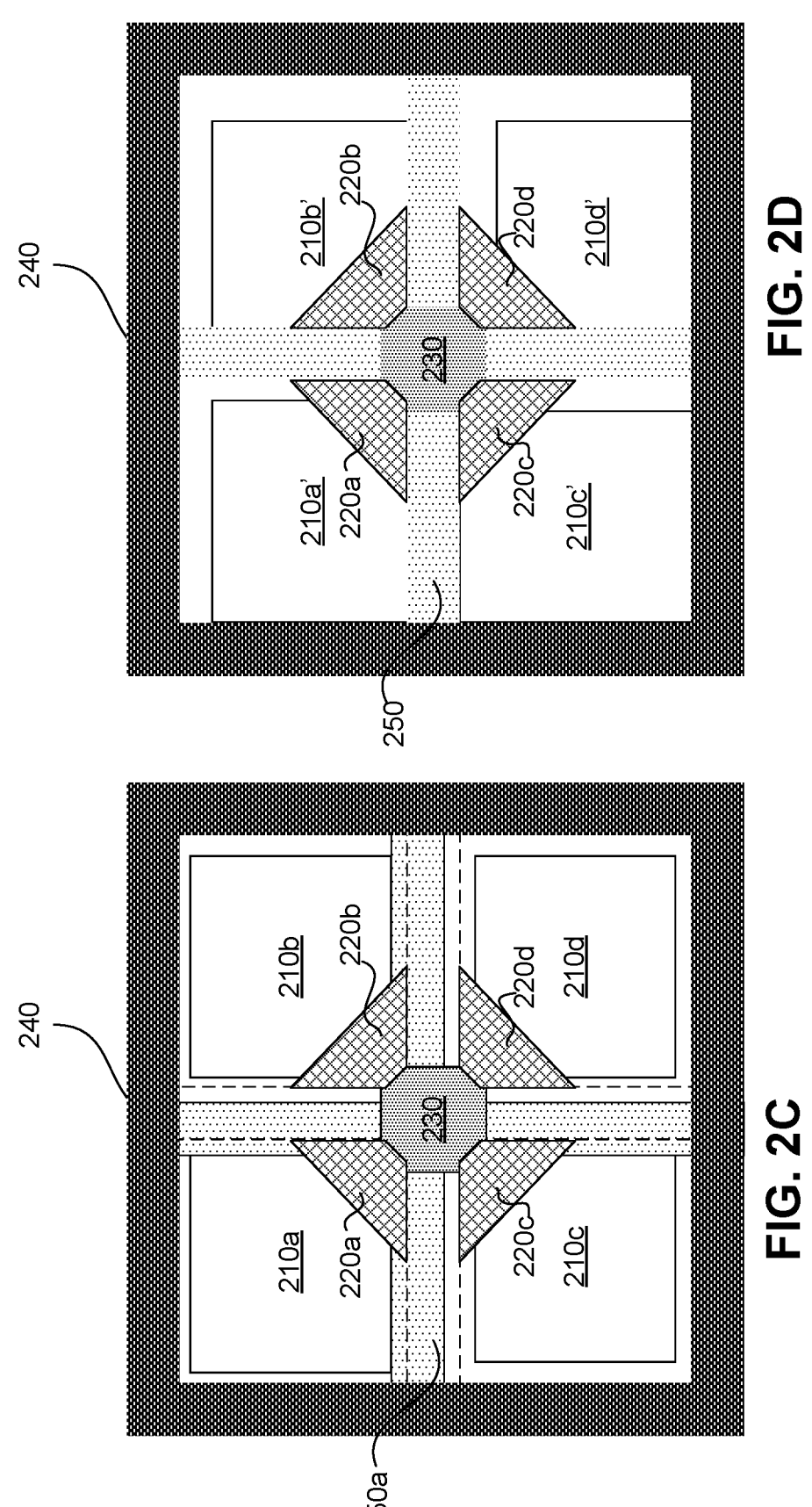
FIGS. 2C-2E illustrates examples of various misalignments among pixel element due to overlay shift accumulation.
Figure 2E:
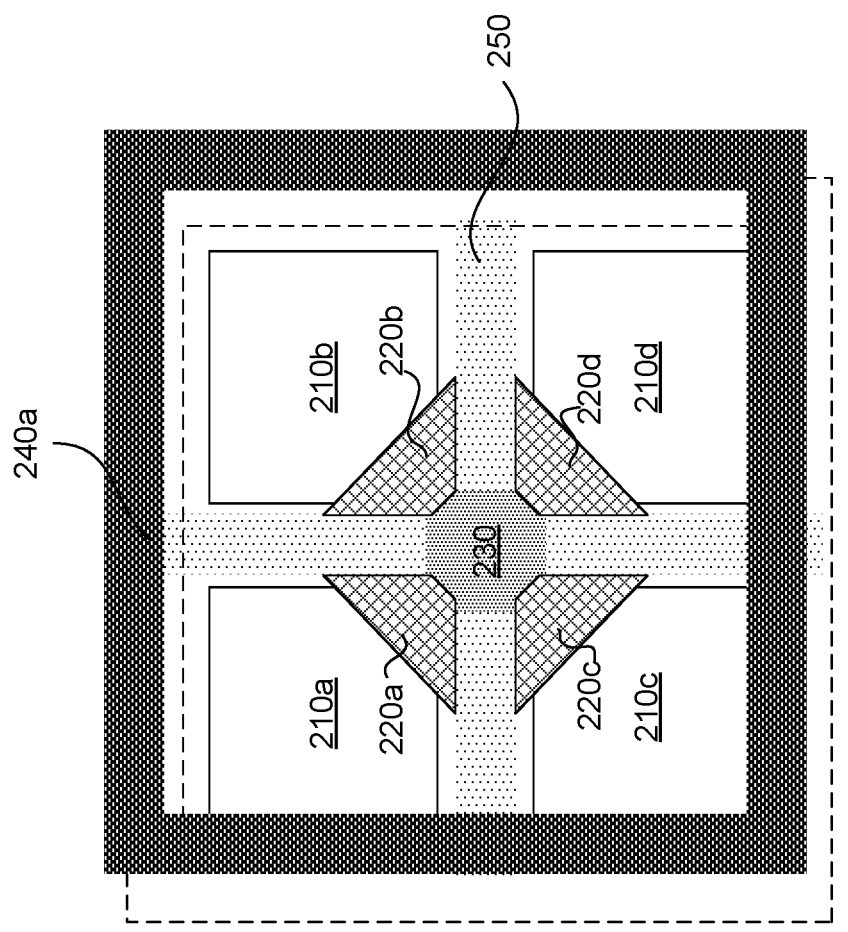

FIG. 2C-FIG. 2E illustrate examples of misalignment between pixel elements due to overlay shift. FIG. 2C shows an example of overlay shift accumulated at the second P-well implant mask layer for forming second isolation well 250. As illustrated, when the implanted second isolation well 250 incurs shift over both X- and Y-directions forming the second isolation well 250a in the wafer, would affects area size of photodiode region as well as full well capacity (FWC) of corresponding photodiodes such as photodiodes 210a, 210c as result of dopant compensation and may even result in FWC asymmetrical issues both within pixel cell 200 as well as across pixel cells. FIG. 2D shows an example of misalignment of photodiode to surround pixel elements (e.g., first/second isolation well 240, 250, transfer gates 220a-220d) due to overlay shift accumulated at photodiode implant mask layer. Overlay shift in photodiode implant not only could affect area sizes of photodiodes 210a'-210d' as well as FWC of corresponding photodiodes 210a'-210d' but also affect charge transfer performance e.g., transfer imbalance leading to image lag. For example, the pinning voltage Vpin, which is an inherent property of a corresponding photodiode that exists as a voltage upon full depletion, could be increased due to higher doping level in overlapped region between photodiode of first conductive type (e.g., n-type) and well regions of second conductive type (e.g., p-type) that may lead to image lag. The first conductive type is opposite to the second conductive type. FIG. 2E shows an example of overlay shift accumulated at the implant mask layer for forming deep portion of first isolation well 240. It can be noted that the implanted deep portion of the first isolation well 240 incurs shift over both X- and Y-directions become the first isolation well 240a, which causes variation of FWC of corresponding photodiodes (e.g., has impact on the corresponding deep portion of photodiodes) result in FWC asymmetrical issues within pixel cell and across pixel cells (e.g., FWC difference across different color channel). It can be noted that misalignment between first and second isolation well 240 and later-formed deep trench isolation structures 260 may lead to insufficient passivation resulting poor dark current performance.

Figure 3:
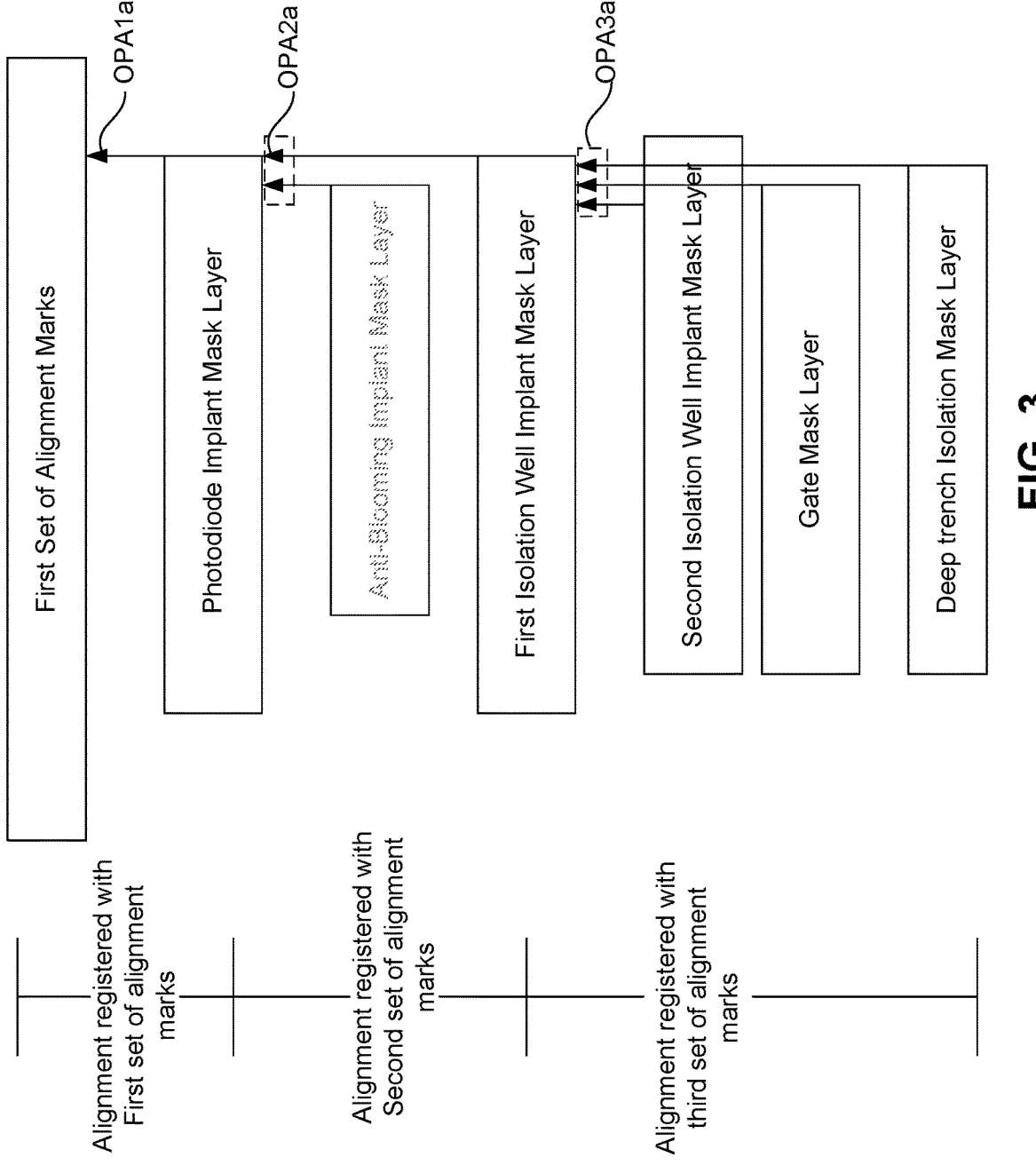
FIG. 3 illustrates an example alignment tree in accordance with the teachings of the present disclosure.

FIG. 3 illustrates an improved alignment tree in accordance with an embodiment of the present disclosure. Instead of having first P-well implant mask layer making reference to first set of alignment marks as the photodiode implant mask layer, the first P-well implant mask layer, the second P-well implant mask layer, are making reference to new set of alignment marks that is different from first set of alignment marks.

In embodiments, the photodiode implant mask layer is disposed making reference to the first set of alignment marks as indicated by the outward pointing arrow OPA1a. The anti-blooming implant mask layer, the first P-well implant mask layer is making alignment reference to a new set of alignment marks (e.g., second set of alignment marks) as indicated by the outward pointing arrow OPA2a, wherein the second set of alignment marks is formed using photodiode implant mask layer. The second P-well implant mask layer, the gate mask layer and the deep trench isolation mask layer are disposed with alignment reference made to another new set of alignment mark (e.g., third set of alignment marks) indicated by the outward pointing arrow OPA3a, wherein the third set of alignment marks is formed using first P-well implant mask layer that is different from the first and the second set of alignment marks. As such, the number of times of alignment transfer between key mask layers can be reduced, for example can be less or equal to two, thereby reduce amount of overlay shift of each formed pixel elements e.g., between photodiode and well regions, between photodiode and transfer gates, and between well regions.

FIG. 4 illustrates a fabrication process for forming alignment marks for process reference for an image sensor in accordance with an embodiment of the present disclosure. FIGS. 5A-5H depict wafer for illustrating respective fabricating process, in accordance with the teachings of the present disclosure. Cross-section figures B-B', C-C', D-D' E-E' respectively illustrate cross-sectional diagram of wafer 50 including an active region and adjacent peripheral region. The active region may be referred as a die region. The active region includes a pixel array region. The peripheral region may be referred as a scribe line region having alignment marks disposed in the peripheral region. The peripheral region may further include a test region including test circuitries and probe contacts (e.g., probe contact pads). The peripheral region may surround the active region or the die region. It is appreciate that cross-section figures B-B', C-C', D-D' E-E' illustrates partial view and simplify cross-sectional representation for illustration, and well-known structures such as photodiodes, floating diffusion region, pixel transistors and the like may have been omitted so as not to obscure the relevant teachings of alignment marks arrangement and formation.

In block 410, a first set of alignment marks is formed in active region and adjacent peripheral region on a front side of a wafer. The first set of alignment marks is formed by the process applied to a front side surface of the wafer. The active region may correspond to a die region (e.g., die 100 of FIG. 1) having pixel circuitry formed therein and peripheral region may surround active region. Peripheral region may correspond to a scribe line region (e.g., scribe line region 110 of FIG. 1) may include probe contact pads, testing circuitry, and alignment mark patterns or structure. For example, a wafer 50, may be similar to wafer 10 of FIG. 1A includes a plurality of active regions or die regions 504 and a plurality of peripheral regions 502. Peripheral region 502 is arranged in between adjacent active regions 502 on the wafer 50. Peripheral region 502 separates adjacent active regions. Peripheral region 502 may surround an active region 504. Peripheral region 502 may be arranged in between active regions 502 and an edge of the wafer 50. In embodiments, the peripheral region 504 is adjacent to at least a die region 504.

Figure 5A:
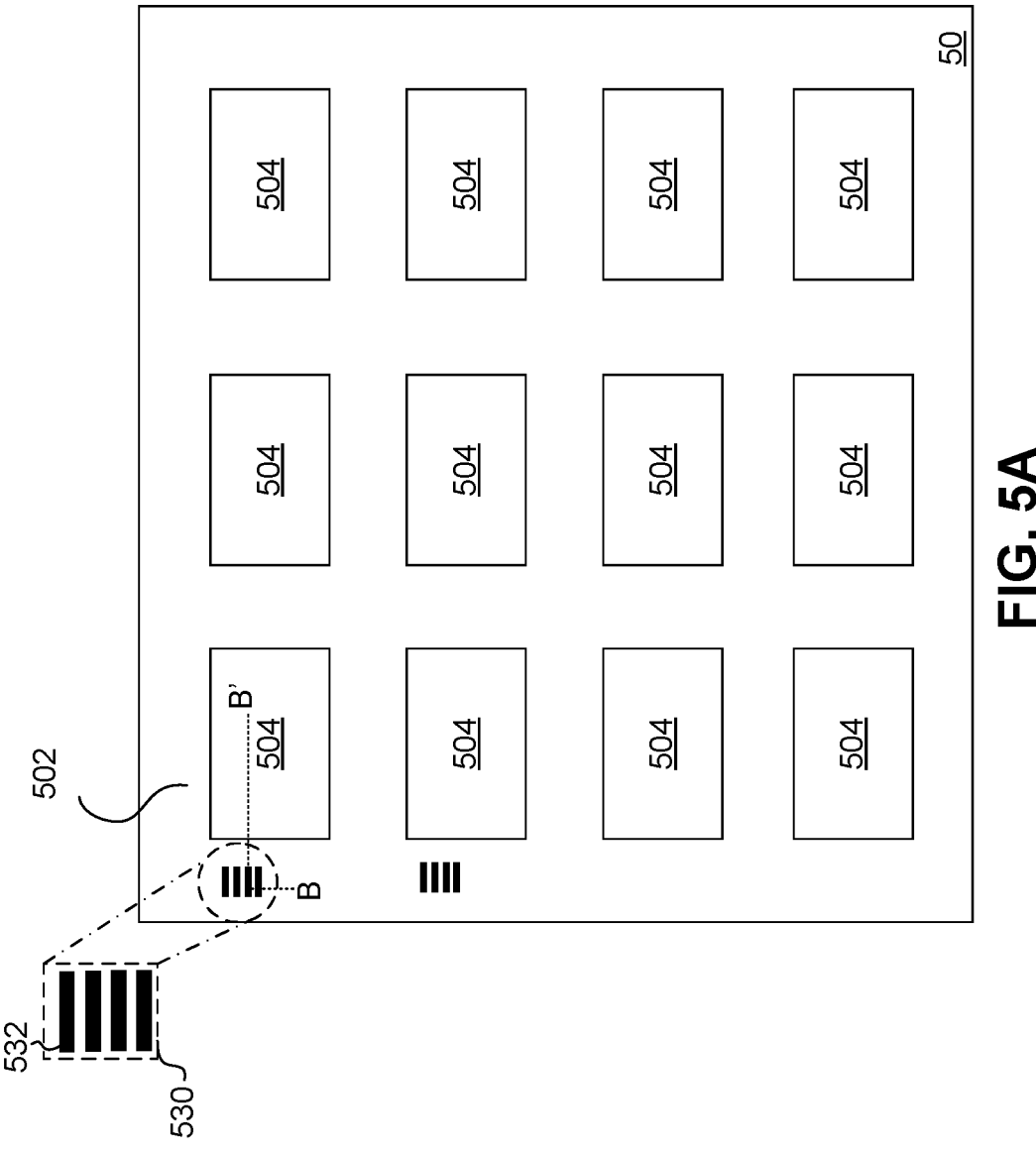
FIGS. 5A-5B illustrate process for forming a first set of alignment mark in the fabrication of image sensor with improvement process alignment, in accordance with the teachings of the present disclosure.
Figure 5B:
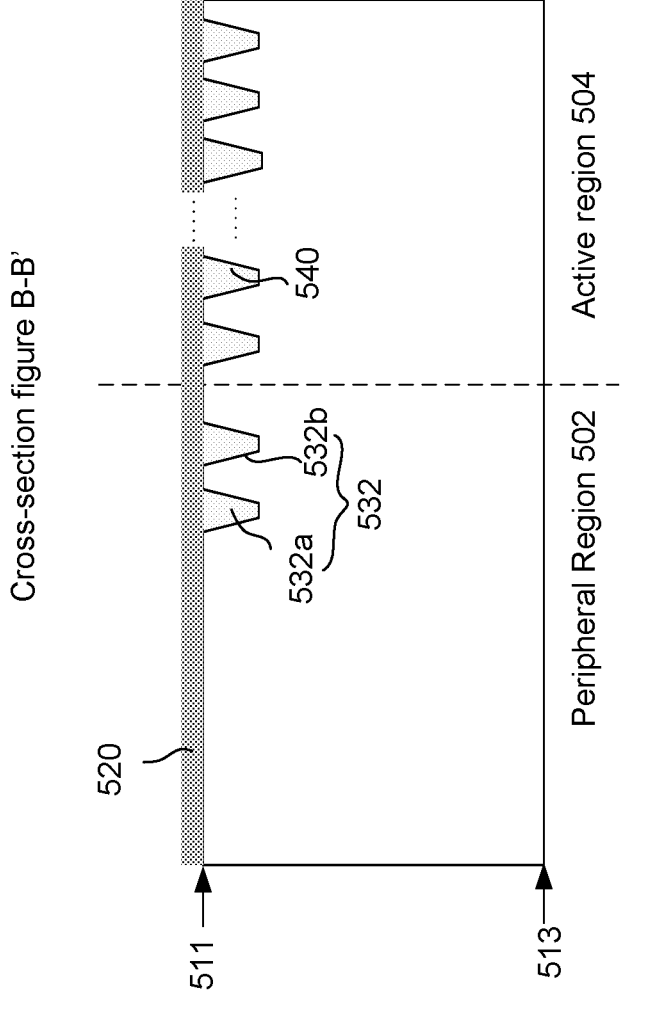

The wafer 50 has a front side 511 and a backside 513 opposite to front side 511 as illustrated in FIG. 5B. The wafer 50 may have a dielectric layer 520 (such as silicon oxide) disposed on the front side 511 surface of the wafer 50. The dielectric layer 520 may serve as a protective dielectric layer for wafer surface protection. Peripheral region 502 includes a first set of alignment marks 532 formed on the front side 511 surface of the wafer 50. Active region 504 may be an example of die 100 of FIG. 1, and peripheral region 502 may be an example of a scribe line region 110. The first set of alignment marks 532 may be in a form of a plurality of shallow trench isolation structures 532a, 532b and formed in peripheral region 502 as depicted in FIG. 5B. For example between active regions 504 or in peripheral region 502 proximate to the edge of wafer 50. The first set of alignment marks 532 may formed in the same process as a plurality of shallow trench isolation structures 540 formed in active region 504. The plurality of shallow trench isolation structures 540 in active region 504 may provide isolation between pixel elements such as between photodiode and pixel transistors e.g., source follower, reset transistor, row select transistor.

The plurality of shallow trench isolation structures 532a, 532b and the plurality of shallow trench isolation structures 540 are formed on front side 511 of the wafer 50. In one example, a plurality of shallow trenches (which may be referred as first shallow trenches) is first etched through front side 511 of the wafer 50 a depth into wafer substrate material of the wafer 50. A filling material such as dielectric material (e.g., oxide-based material) is subsequently filled into the plurality of shallow trenches etched to form plurality of shallow trench isolation structures 532a, 532b, 540. In embodiments, the plurality of shallow trench isolation structures 532a, 532b for forming the first set of alignment marks 532 in peripheral region 502 and the plurality of shallow trench isolation structures 540 in active region 504 may have substantially the same structural characteristic such as same trench width, same trench depth and/or same trench profile.

As show in zoom view 530, the first set of alignment marks 532 may include four shallow trench isolation structures (such as shallow trench isolation structures 532a, 532b) arranged in parallel to each other. In the illustrated example, the alignment mark patterns or structure may be in a formed of shallow trench isolation structures having stripe or bar like shape. It is appreciated, the first set of alignment marks 532 may include more or less number of one or more shallow trench isolation structures and with shape such as circular, rectangular, square, triangular, depends on the pattern marking needs.

Figure 5C:
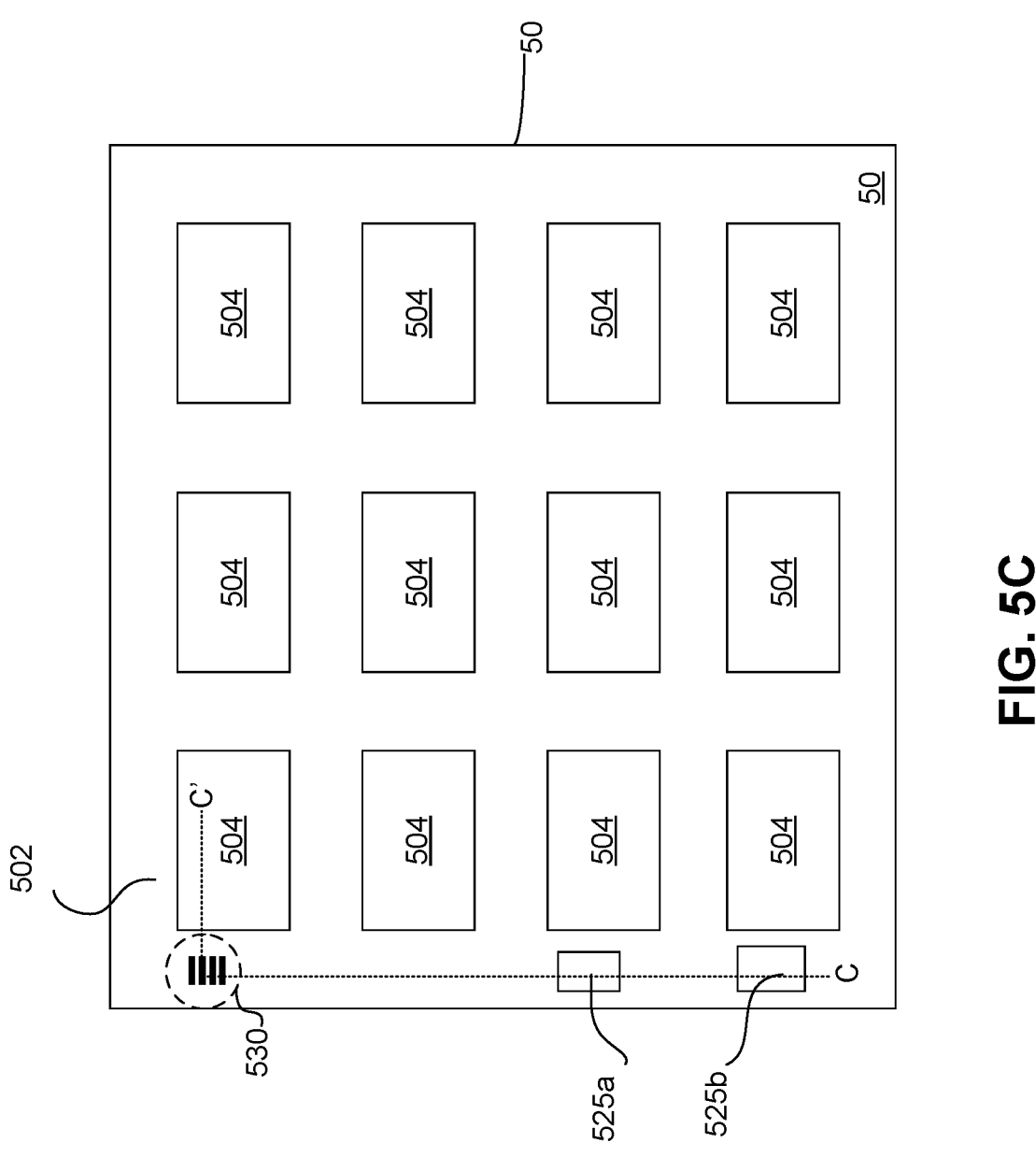
FIGS. 5C-5F illustrate process for forming a second set of alignment marks in the fabrication of image sensor with improvement process alignment, in accordance with the teachings of the present disclosure.
Figure 5D:
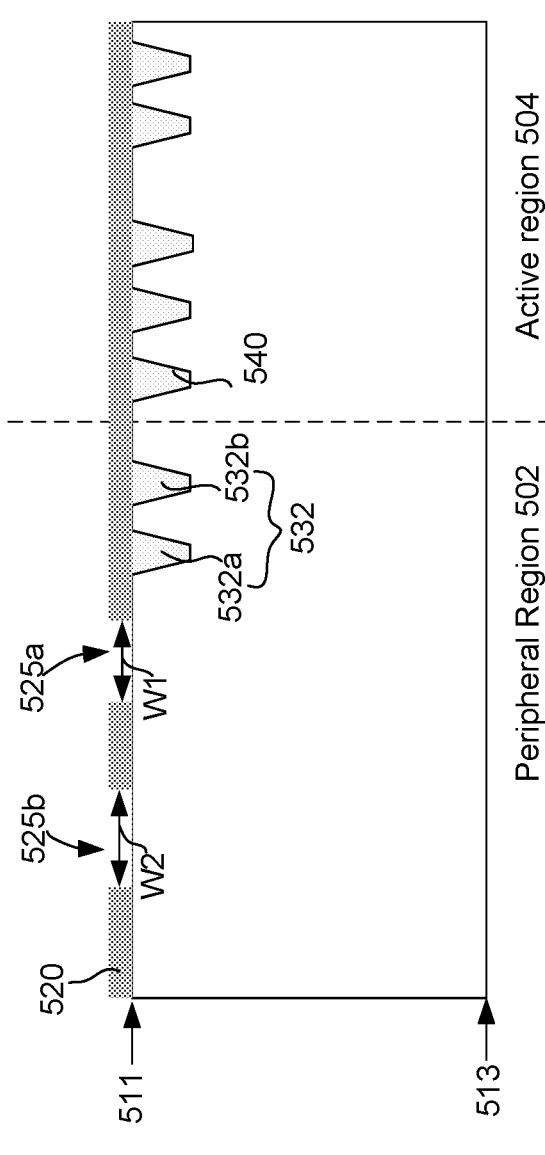

Referring to FIG. 5C and FIG. 5D, after block 410, a photoresist mask layer (not illustrated) patterned with opening positions corresponding to one or more new sets of alignment marks (e.g., second and third sets of alignment marks) is disposed on the dielectric layer 520. For example, photoresist layer (not illustrated) patterned with opening positions corresponding to openings 525a, 525b having opening width W1, W2, respectively in the peripheral region 502 may be disposed on the dielectric layer 520, follow by etching process (e.g., dry etching) to form openings 525a, 525b on the dielectric layer 520 in the peripheral region 502 for subsequent alignment mark pattern formation. For example, a selective etching process is then applied to remove portions of the dielectric layer 520 within openings 525a, 525b exposing front side 511 surface of the wafer 50. In some embodiments, openings 525a, 525b may be arranged to be in peripheral region 502 proximate to an edge of the wafer 502.

In block 420, a photodiode implant mask layer is disposed on the front side of the wafer with alignment registered using the first set of alignment marks as reference for photodiode implantation in the active region. In other words, the photodiode implant mask layer for forming the plurality of photodiodes in the active region on the front side of wafer is disposed with alignment reference registered to the first set of alignment marks. In block 430, a second set of alignment marks is formed in peripheral region on the wafer using the photodiode implant mask layer. The second set of alignment marks may be arranged to be in the peripheral region proximate to an edge of the wafer.

Figure 5E:
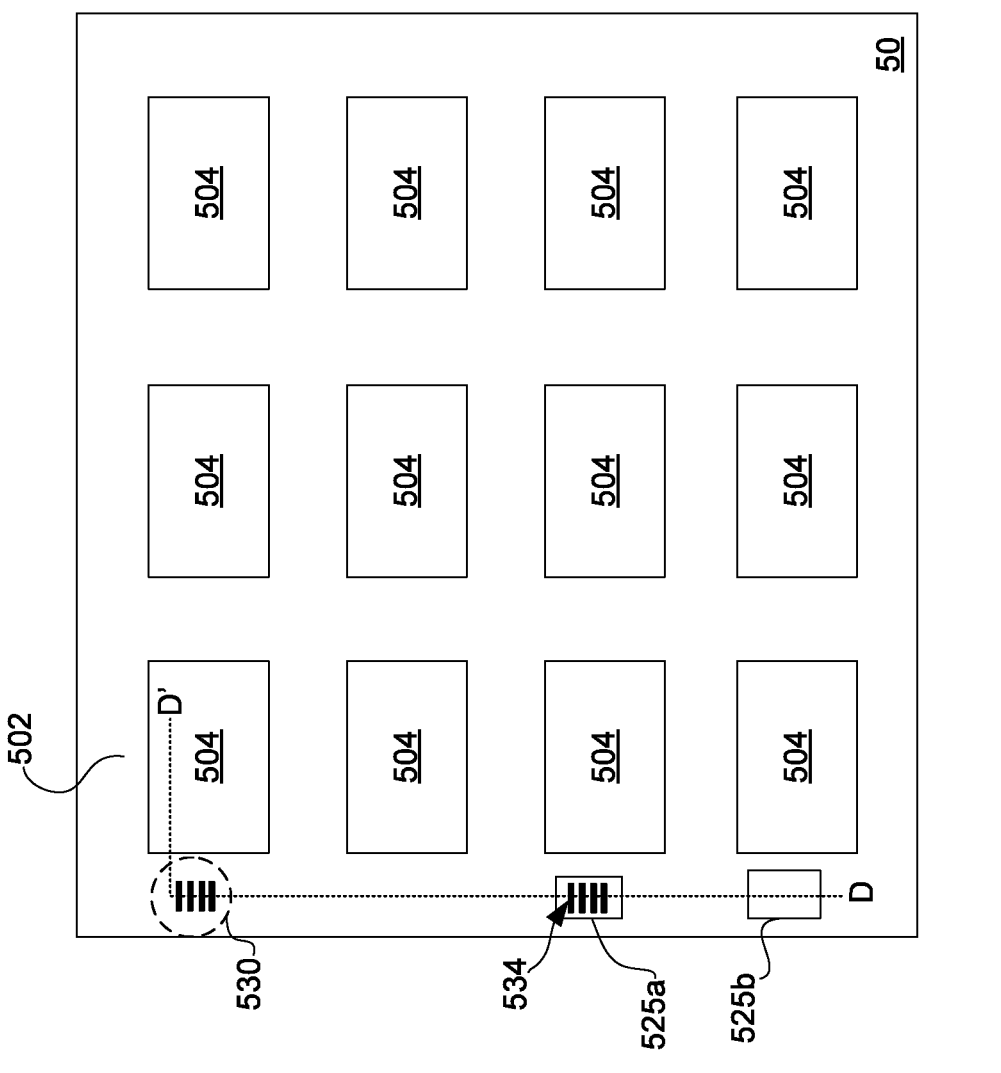
Figure 5F:
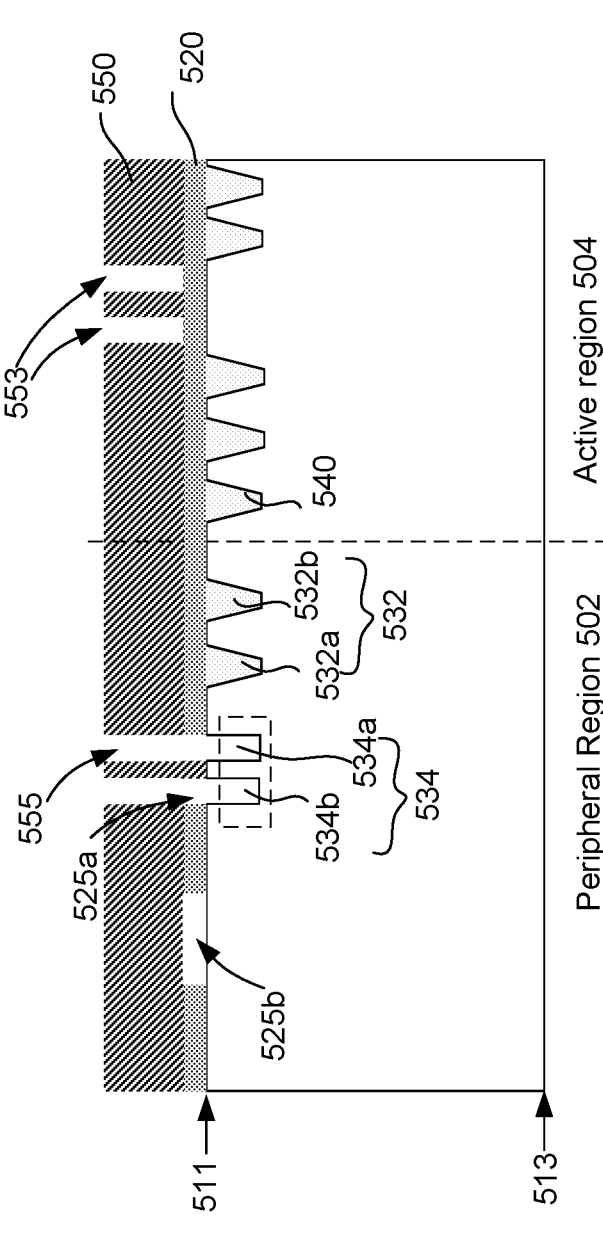

Refer to FIG. 5E and FIG. 5F, a photoresist mask layer 550 for photodiode implants (e.g., photodiode implant mask layer) is disposed on the front side 511 surface of the wafer 50 with alignment registered to first set of alignment marks 532 e.g., with alignment made to the shallow trench isolation structures 532a, 532b. The photoresist mask layer 550 may be patterned with openings 553 for photodiode implantation forming photodiode doped region for a plurality of photodiodes (such as photodiode 210a-210d of FIG. 2B) in each of active regions 504 on the wafer 50 and openings 555 for forming a second set of alignment marks 534 in respective peripheral region 502 on the wafer 50. The opening width W1 of opening 525a is greater than the trench width of each individual shallow trenches 534a, 534b.

In embodiments, the second set of alignment marks 534 includes a plurality of shallow trenches 534a, 534b (may also be referred as second shallow trenches) arranged within the region of opening 525a. Each of the plurality of shallow trenches 534a, 534b (second shallow trenches) can be etched from front side 511 of the wafer 50 through photoresist mask layer 550 and opening 525a on the dielectric layer 520 to form the second set of alignment marks 534 on the wafer 50 for subsequent process alignment. Each of the plurality of shallow trenches 534a, 534b (second shallow trenches) may extend a depth into wafer substrate martial of the wafer 50 from front side 511. The depth that each of the plurality of shallow trenches 534a, 534b (second shallow trenches) extend into the wafer 50 may be the same as the depth that each of the shallow trench isolation structures 532a, 532b extends into the wafer 50. The width W1 of the opening 525a may be configured based on the number of shallow trenches 534a, 534b (second shallow trenches) used to form the second set of alignment marks 534. The spacing between adjacent shallow trenches 534a, 534b included in the second set of alignment marks 534 may be the same as the spacing between adjacent shallow trench isolation structures 532a, 532b included in the first set of alignment marks 532. In some embodiments, the number of shallow trenches 534a, 534b included in the second set of alignment marks 534 may be the same as the number shallow trench isolation structures 532a, 532b included in the first set of alignment marks 532. In some embodiments, the number of shallow trenches 534a, 534b included in the second set of alignment marks 534 may be different from (e.g., more or less than) the number shallow trench isolation structures 532a, 532b included in the first set of alignment marks 532.

In embodiments, each of the shallow trenches 534a, 534b for the second set of alignment marks 534 may have a shape of one of circular, squared, rectangular, triangular, bar, stripe, rod-like, and cross-bar. In some embodiments, the second set of alignment marks 534 may formed of one or more pad trenches. It is appreciated that each of the shallow trenches 534a, 534b of the second set of alignment marks 534 can take different form and shape so long that the second set of alignment marks 534 being visible or at least optically detectable by the processing tools for alignment registration.

In block 440, a first isolation well implant mask layer is disposed on the front side of the wafer with alignment registered using the second set of alignment marks for reference. In other words, the first isolation well implant mask layer for implanting a plurality of first isolation well regions in the active region of the wafer between adjacent photodiodes has alignment registered to the second set of alignment marks. Similarly, the anti-blooming implant mask layer for blooming leakage path implantation may also be disposed with alignment reference made to the second set of alignment marks. In embodiments, during alignment, isolation well implant mask layer may fill the shallow trenches included in the second set of alignment marks so as to register the alignment of first isolation well implant mask layer.

In block 450, a third set of alignment marks is formed in the peripheral region on the wafer using the first isolation well implant mask layer. The third set of alignment marks may be arranged to be adjacent to the second set of alignment marks. The third set of alignment marks may be arranged to be in the peripheral region proximate to the edge of the wafer.

Figure 5G:
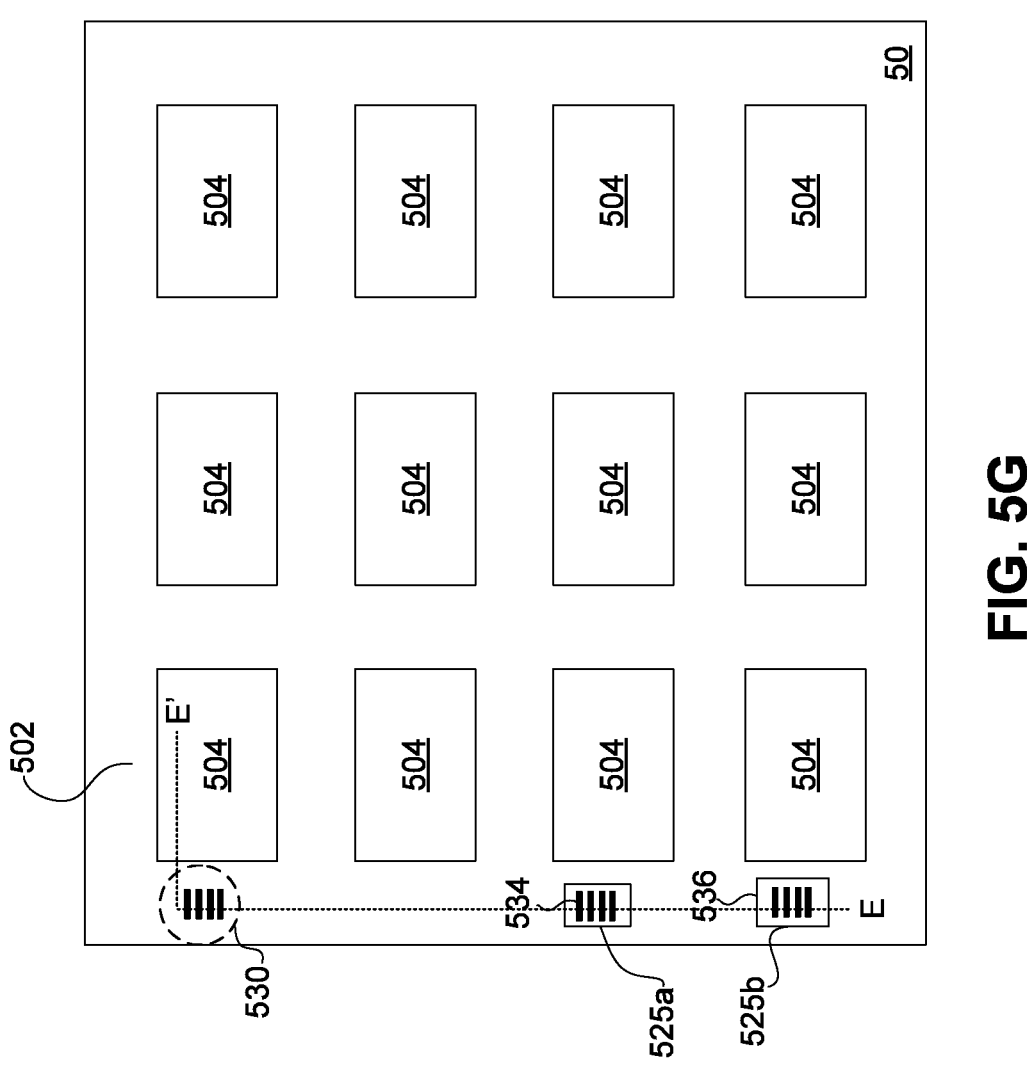
FIGS. 5G-5H illustrate process for forming a third set of alignment marks in the fabrication of image sensor with improvement process alignment, in accordance with the teachings of the present disclosure.
Figure 5H:
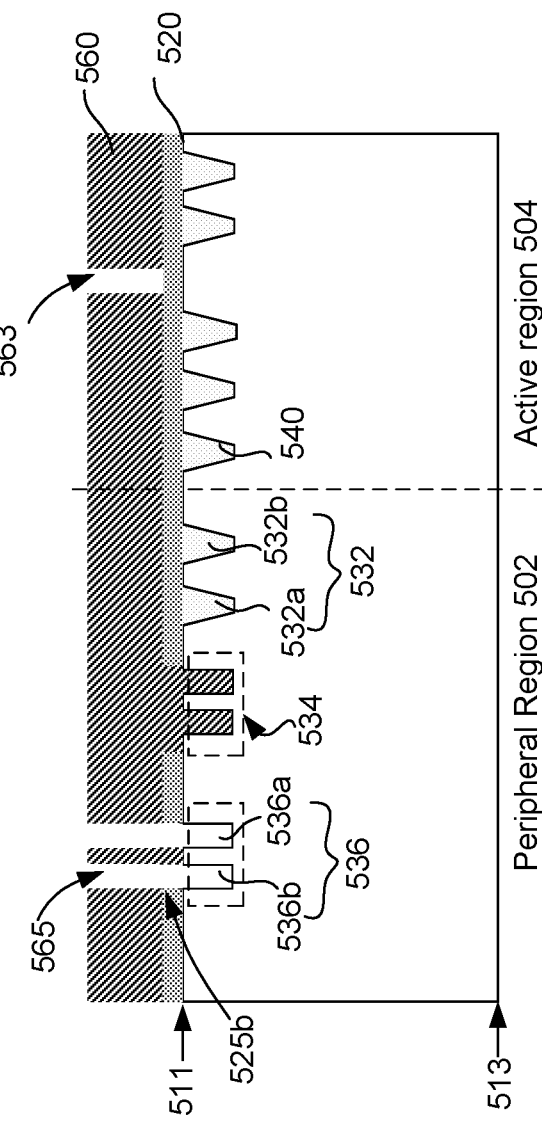

Refer to FIG. 5G and FIG. 5H, a photoresist mask layer 560 for first isolation well implantation is disposed on the dielectric layer 520 on the front side 511 of the wafer 50. The photoresist mask layer 560 may be patterned with openings 563 for first isolation well implantation forming a plurality of isolation well having opposite conductive to photodiodes in each of active region 504 and openings 565 for a third set of alignment marks 536 formation in wafer 50. The photoresist mask layer 560 is disposed on the front side 511 with alignment made to the second set of alignment marks 534. During alignment registration, the material of the photoresist mask layer 560 may be disposed and filled into the plurality of shallow trenches 534a, 534b included in the second set of alignment marks 534. For example, the photoresist mask layer 560 may have marks correspond to the position of the second set of alignment marks 534 as alignment reference. In some embodiments, after the formation of the third set of alignment marks 536, photoresist mask layer 560 may be removed by stripe and clean process, and during which the portion of photoresist mask layer 560 filled into the plurality of shallow trenches 534a, 534b (second shallow trenches)

can be removed restore the plurality of shallow trenches 534a, 534b to the state without any material filled in. In some embodiments, the plurality of shallow trenches 534a, 534b (second shallow trenches) may be later filled with filling material such as dielectric material (e.g., oxide-based material). In some embodiments, the plurality of shallow trenches 534a, 534b (second shallow trenches) may be later filled with filling material such as conductive material (e.g., metal material like aluminum tungsten) to form pad trench structures or pad electrodes. In some embodiments, one or more pad trench structures or pad electrodes included in the second set of alignment marks 534 may serve as connection or contact pads enabling connections such as wire bonding or probe contact connection to be formed.

In embodiments, the third set of alignment marks 536 includes a plurality of shallow trenches 536a, 536b (may also be referred as third shallow trenches). Each of the plurality of shallow trenches 536a, 536b (third shallow trenches) can be etched in the wafer 50 through openings 565 of photoresist mask layer 560 and opening 525b on the dielectric layer 520 to form the third set of alignment marks 536 for subsequent process alignment. Each of the plurality of shallow trenches 536a, 536b (third shallow trenches) extend a depth into the wafer 50 from front side 511. In embodiments, the depth that each of the plurality of shallow trenches 536a, 536b extend into the wafer 50 may be the same as the depth that each individual shallow trenches 534a, 534b (associated with the second set of alignment marks 534) extends into the wafer 50. The width W2 of the opening 525b is greater than the trench width of each individual shallow trenches 536a, 536b. The width of the opening 525b may be configured based on the number of shallow trenches 536a, 536b used to form the third set of alignment marks. The number of shallow trenches 536a, 536b included in the third set of alignment marks 536 may be configured based on needed alignment mark patterns and can be more or less than the illustration in FIG. 5D.

In embodiments, similar to the second set of alignment marks 534, each of the shallow trenches for the third set of alignment marks 536 may have a shape of one of circular, squared, rectangular, bar, stripe, rod-like, and cross-bar. In some embodiments, the third set of alignment marks 536 may comprise one or more pad trenches or one or more pad electrodes that are formed on font side 511 surface of the wafer 50. One or more pad electrodes may be formed by filling shallow trenches 536a, 536b with conductive material. One or more pad trenches may be formed by partially filling shallow trenches 536a, 536b with conductive material enabling connections such as wire bonding or probe contact connection to be formed. It is appreciated that the third set of alignment marks 536 can take different form and shape so long that the third set of alignment marks 534 being visible or at least optically detectable by the processing tools for alignment registration.

In embodiments, the first, second and third set of alignment marks 532, 534, 536 are visible pattern or optically detectable patterns, for example to processing tools such as deep-ultraviolet photolithography tool e.g., KrF-based photolithography tool.

In embodiments, an intra isolation well implantation may form a plurality of intra isolation wells (e.g., second isolation well 250 of FIG. 2B) the between adjacent photodiodes. In at least one embodiment, isolation wells are example of second isolation well 250 formed between adjacent photodiodes within a pixel cell.

In block 460, forming gate electrode with a gate mask layer that has alignment registered with reference to the third set of alignment marks. In an example, the gate mask layer or photoresist mask layer used for gate electrode formation) with patterns corresponding to gate electrodes is disposed on the first side of wafer with material of the gate mask layer filling the shallow trenches of the third set of alignment marks during alignment registration. In one embodiment, floating diffusion region and source/drain regions for pixel transistors may be implanted with alignment made to gate electrode such as aligning implant with edges of transfer gate and gate electrodes for pixel transistors. In some embodiments, after block 450 but prior to block 460, additional inter-isolation well implant mask layer may be used with alignment made also to the third set of alignment marks 536 for forming inter-isolation wells, e.g., first isolation well 240 surrounding pixel cell 200 of FIG. 2B. Additional process mask layer for forming additional implanted region such as source/drains region and floating diffusion regions in active region may also have alignment made also to the third set of alignment marks.

Additional inter deep isolation well implant mask layer (e.g., third isolation well implant mask layer) can be disposed on the front side of the wafer and with alignment made to the third set of alignment mark to form deep isolation wells aligning with first and/or inter-isolation wells. In some embodiments, the additional inter deep isolation well implant mask layer for deep isolation wells may be omitted, deep isolation wells may be implemented using inter-isolation well implant mask layer for inter-isolation well implantation with alignment registered with third set of alignment marks.

In block 470, a deep trench isolation well implant mask layer is disposed on the backside of the wafer with alignment registered also to the third set of alignment marks disposed on the front side of the wafer for forming a plurality of deep trench isolation structures between photodiodes in active region on wafer. Each of the plurality of deep trench isolation structures is extended from backside of the wafer into wafer substrate material.

By making additional set of alignment marks in between mask layers for forming key pixel elements can thus reduce number of alignment transfer such as reduced to less or equal to two which in turns can reduce amount of overlay shift, thereby improve alignment accuracy between mask layers.

Figure 6:
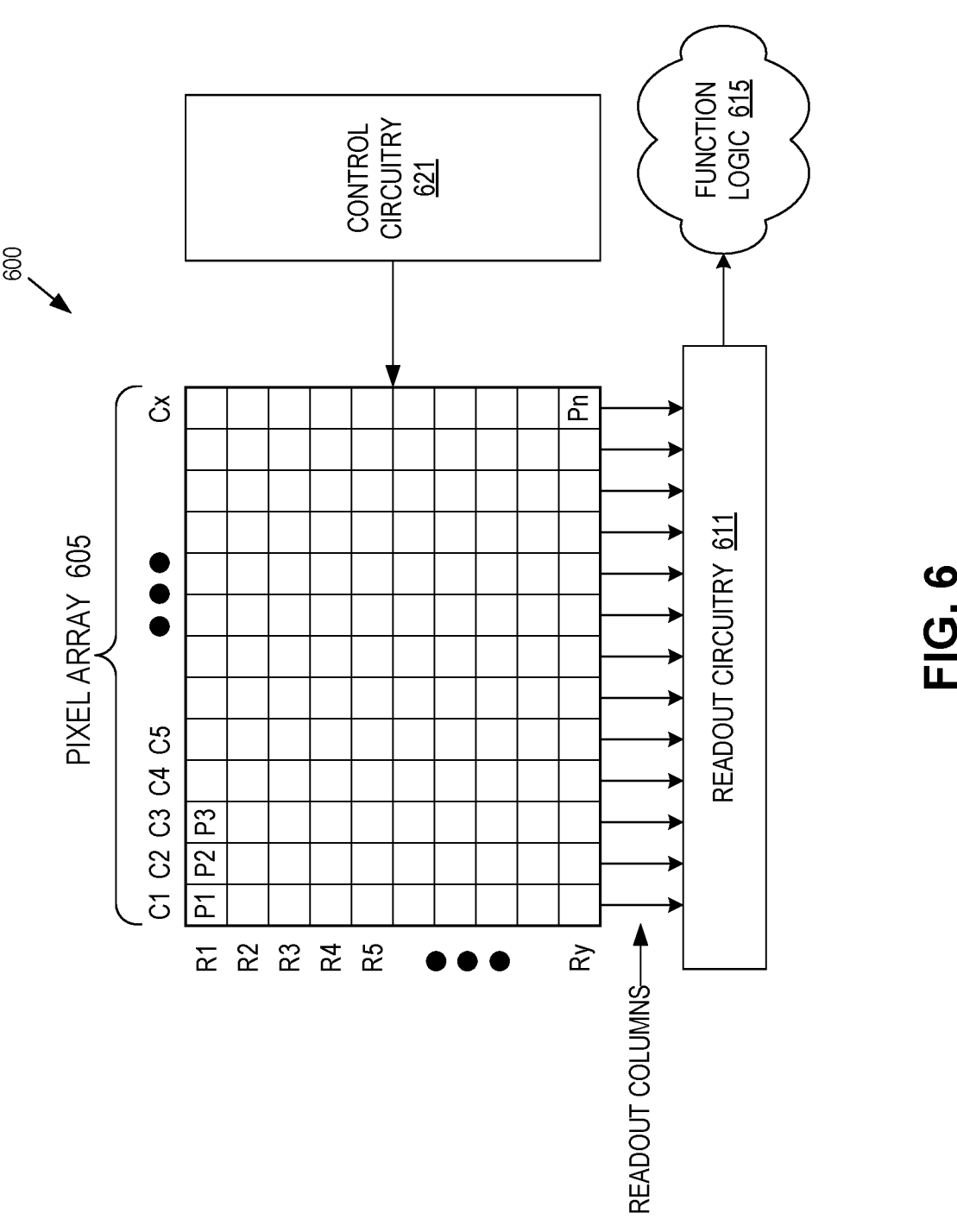
FIG. 6 illustrates a block diagram of an imaging system in accordance with an embodiment of the present disclosure.

FIG. 6 illustrates a block diagram of an imaging system 600, in accordance with an embodiment of the present disclosure. Imaging system 600 includes pixel array 605, control circuitry 621, readout circuitry 611, and function logic 615. In one embodiment, pixel array 605 is a two-dimensional (2D) array of photodiodes, or image sensor pixels (e.g., pixels P1, P2 . . . , Pn). Photodiodes, or image sensor pixels (e.g., pixels P1, P2 . . . , Pn) may be formed using the aforementioned alignment method. As illustrated, photodiodes are arranged into rows (e.g., rows R1 to Ry) and columns (e.g., column C1 to Cx) to acquire image data of a person, place, object, etc., which can then be used to render an image or video of the person, place, object, etc. However, photodiodes do not have to be arranged into rows and columns and may take other configurations.

In one embodiment, after each image sensor photodiode/ pixel in pixel array 605 has acquired its image data or image charge, the image data is readout by readout circuitry 611 and then transferred to function logic 615. In various examples, readout circuitry 611 may include amplification circuitry, analog-to-digital (ADC) conversion circuitry, or otherwise. Function logic 615 may simply store the image data or even manipulate the image data by applying post image effects (e.g., autofocus, crop, rotate, remove red eye, adjust brightness, adjust contrast, or otherwise). In the same or another embodiment, readout circuitry 611 may readout a row of image data at a time along readout column lines (illustrated) or may readout the image data using a variety of other techniques (not illustrated), such as a serial readout or a full parallel readout of all pixels simultaneously. In one embodiment, control circuitry 621 is coupled to pixel array 605 to control operation of the plurality of image sensor pixels in pixel array 605. For example, control circuitry 621 may generate a shutter signal for controlling image acquisition. In some embodiments, control circuitry 621 may be configured to generate drive signals e.g., transfer signals, reset signals, and row-select signals for controlling the operation of pixel circuitries associated with pixels in image sensor pixel array 605.

It is appreciated that imaging system 600 may be included in a digital camera, cell phone, laptop computer, automobile, or the like. Additionally, imaging system 600 may be coupled to other pieces of hardware such as a processor (general purpose or otherwise), memory elements, output (USB port, wireless transmitter, HDMI port, etc.), lighting/ flash, electrical input (keyboard, touch display, track pad, mouse, microphone, etc.), and/or display. Other pieces of hardware may deliver instructions to imaging system 600, extract image data from imaging system 100, or manipulate image data supplied by imaging system 600.

It is further appreciated that while the block diagram illustrated in FIG. 1 shows pixel array 605, readout circuitry 611, function logic 615, and control circuitry 621 as distinct and separate elements from the pixel array, this is not necessarily the case as such features may be combined or otherwise incorporated with the pixel array directly (e.g., within and/or between individual pixels, in the form of stacked substrates, or otherwise). For example, the readout circuitry 611 may include one or more transistors (e.g., associated with 3T, 4T, 5T, or other pixel architectures for reading out image charge from individual pixels), elements of which may be disposed between segments of individual photodiodes in accordance with embodiments of the present disclosure. Furthermore, the image sensor 100 may include features not explicitly illustrated or discussed but known by one of ordinary skill in the art such as color filters, microlenses, a metal grids, and the like. Additionally, it is appreciated that image sensor 600 is fabricable by conventional CMOS manufacturing techniques known by one of ordinary skill in the art, which may include, but is not limited to, photolithography, chemical vapor deposition, physical vapor deposition, ion implantation or diffusion, thermal oxidation, reactive ion etching, wet chemical etching, and the like using the improved alignment method such as process illustrated in FIG. 4 and FIGS. 5A-5H.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the disclosure is to be determined entirely by the following claims, which are to be construed in accordance with established doctrines of claim interpretation. Deviations from the particular embodiments shown will be apparent to those skilled in the art, particularly in view of the foregoing disclosure.

What is claimed is:

1. A method for fabricating an image sensor, comprising:

providing a wafer having a front side and a backside opposite to the front side, the wafer including at least an active region and a peripheral region adjacent to the active region;

forming a first set of alignment marks in the peripheral region on the front side of a wafer adjacent to the active region;

forming a plurality of photodiodes in the active region on the front side using a photodiode implant mask layer with alignment reference registered to the first set of alignment marks;

forming a second set of alignment marks in the peripheral region on the front side surface using the photodiode implant mask layer;

forming a plurality of first isolation well regions in the active region between adjacent photodiodes using a first isolation implant mask layer with alignment registered to the second set of alignment marks;

forming a third set of alignment marks in the peripheral region on the front side surface using the first isolation implant mask layer; and forming a plurality of deep trench isolation in the active region on a backside of the wafer using a deep trench isolation mask layer with alignment registered to third set of alignment marks.

2. The method according to claim 1, wherein the plurality of photodiodes are grouped into a plurality of pixel cells, and the process after the formation of third set of alignment marks comprises:

forming a plurality of second isolation well regions in the active region using a second isolation implant mask layer with alignment registered to the third set of alignment marks; and forming a plurality of transfer gates in the active region using a gate mask layer with alignment registered to the third set of alignment.

3. The method according to claim 1, wherein the active region includes a pixel array region and the peripheral region is a scribe line region.

4. The method according to claim 3, wherein the peripheral region is between an active region and an edge of the wafer.

5. The method according to claim 1, the process of forming first set of alignment marks, comprising:

forming a plurality of first shallow trenches on the front side of the wafer in the active region and in the peripheral region; and filling the plurality of first shallow trench with a dielectric material to form the plurality of shallow trench isolation structures;

wherein the shallow trench isolation structures in the active region electrically isolates photodiodes from a plurality of pixel transistors, and the shallow trench isolation structures in the peripheral region serve as mask alignment reference.

6. The method according to claim 5, prior to the formation of the second set of alignment marks further comprising:

depositing a dielectric material forming a dielectric layer on the front side surface; and etching the dielectric layer to form a first opening on the dielectric layer in the peripheral region corresponding to the second set of alignment marks and a second opening on the dielectric layer in the peripheral region corresponding to the third set of alignment marks;

wherein the second set of alignment marks is formed within the first opening of the dielectric layer, and the third set of alignment marks is formed within the second opening of the dielectric layer.

7. The method according to claim 6, the dielectric layer comprising of oxide-based material.

8. The method according to claim 6, the process of forming second set of alignment marks, further comprising:

etching a plurality of second shallow trenches in the peripheral region on the front side of the wafer within the first opening through the photodiode implant mask layer.

9. The method according to claim 8, the process of forming second set of alignment marks, further comprising:

depositing a conductive material into the plurality of second shallow trenches in the peripheral region to form a plurality of pad trench structures.

10. The method according to claim 9, the process of forming a plurality of first isolation well regions, comprising:

forming the first isolation well implant mask layer having a plurality of patterns corresponding to the third set of alignment marks;

disposing the first isolation well implant mask on the front side of the wafer with alignment registered to the second set of alignment marks; and wherein the first isolation well implant mask is disposed filling the plurality of second shallow trenches within the first opening in the peripheral region.

11. The method according to claim 1, wherein the number of alignment transfer of each of the first set of alignment marks, the second set of alignment marks, and the third set of alignment marks being less or equal to two.

\* \* \* \* \*